United States Patent [19]
Dillon

[11] Patent Number: 6,093,214
[45] Date of Patent: Jul. 25, 2000

[54] STANDARD CELL INTEGRATED CIRCUIT LAYOUT DEFINITION HAVING FUNCTIONALLY UNCOMMITTED BASE CELLS

[75] Inventor: Michael N. Dillon, Richfield, Minn.

[73] Assignee: LSI Logic Corporation, Milpitas, Calif.

[21] Appl. No.: 09/031,956

[22] Filed: Feb. 26, 1998

[51] Int. Cl.$^7$ ................................................. G06F 17/50
[52] U.S. Cl. ............................... 716/17; 716/18; 716/8
[58] Field of Search ............................. 395/500.02–500.22; 716/1–21

[56] References Cited

U.S. PATENT DOCUMENTS

| | | | |
|---|---|---|---|
| 4,839,821 | 6/1989 | Murakata | 716/9 |
| 5,157,618 | 10/1992 | Ravindra et al. | 716/16 |
| 5,225,991 | 7/1993 | Dougherty | 716/9 |
| 5,623,420 | 4/1997 | Yee et al. | 716/1 |
| 5,798,937 | 8/1998 | Bracha et al. | 716/9 |
| 5,801,960 | 9/1998 | Takano et al. | 716/10 |
| 5,923,563 | 7/1999 | Lavin et al. | 716/19 |
| 5,991,524 | 11/1999 | Belkhale et al. | 395/500.19 |

*Primary Examiner*—Phallaka Kik
*Attorney, Agent, or Firm*—Westman, Champlin & Kelly, P.A.

[57] ABSTRACT

A method of forming a layout definition of a semiconductor integrated circuit includes generating a netlist of functionally committed standard cell instances and the electrical interconnections between the standard cell instances. The standard cell instances are then placed in a layout pattern. Also, functionally uncommitted base cells are place with the standard cell instances in the layout pattern. The base cell instances may be metalized, if needed, in later processing steps to implement design changes by adding additional logical functions.

21 Claims, 5 Drawing Sheets

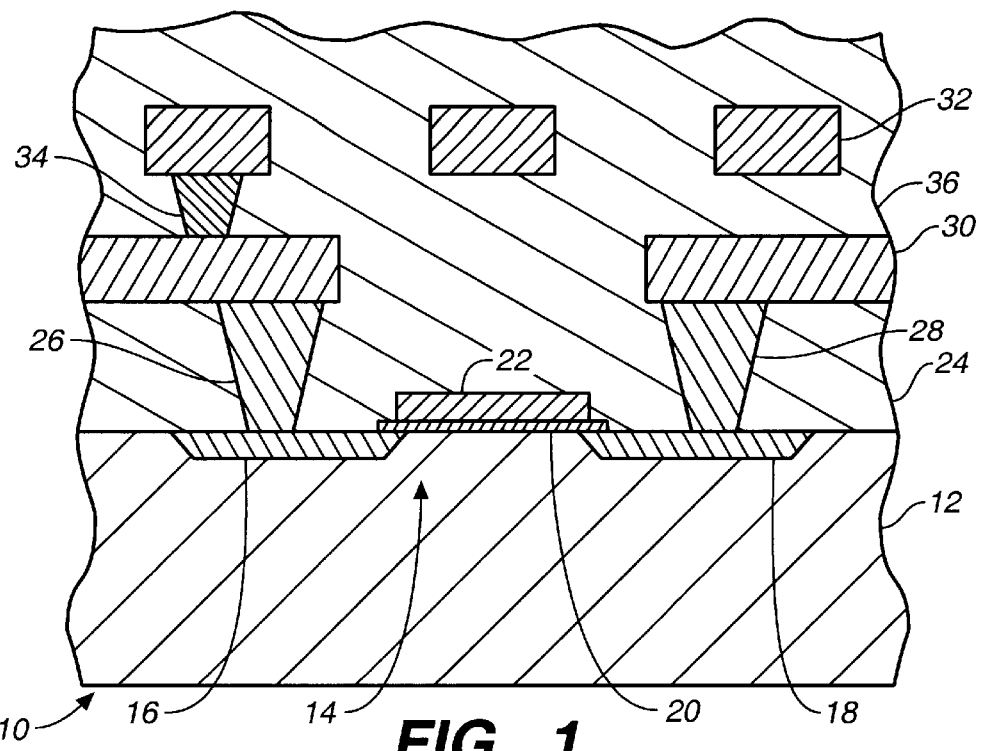
FIG._1
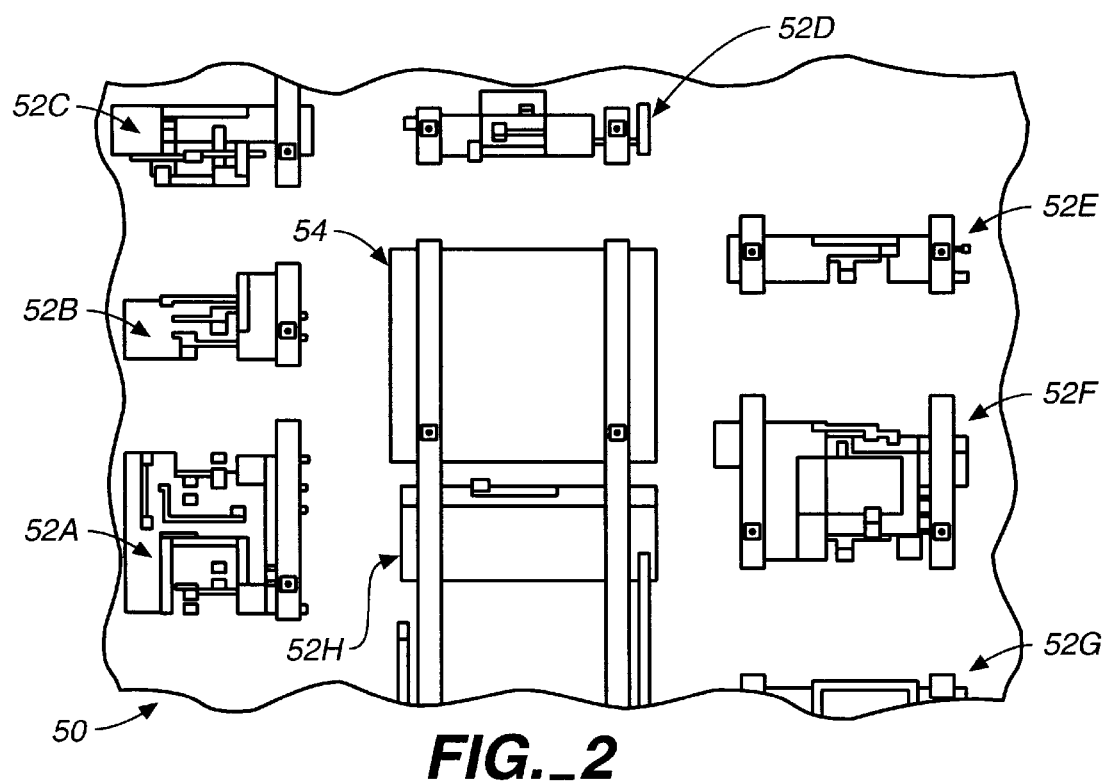
FIG._2

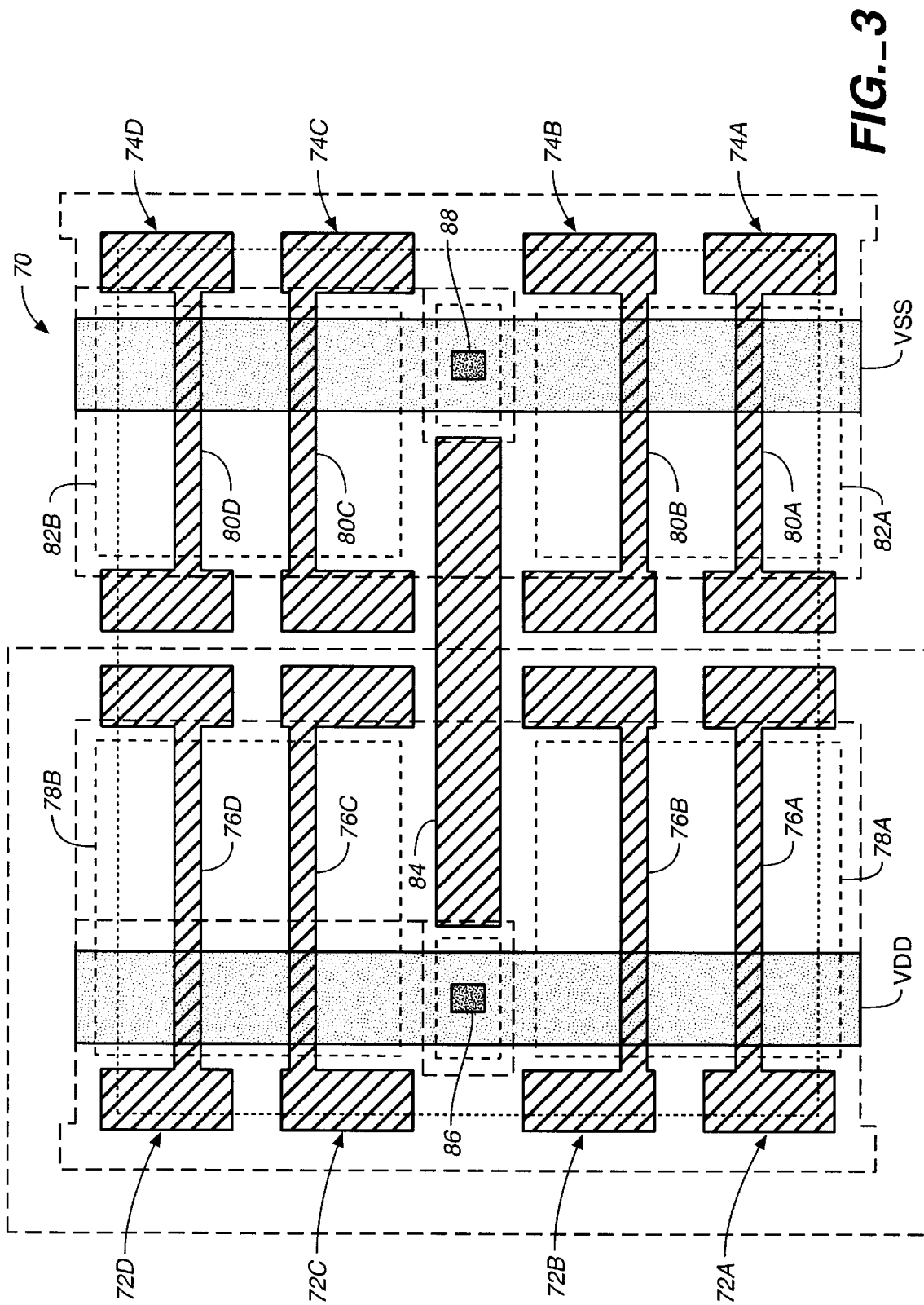
FIG._3

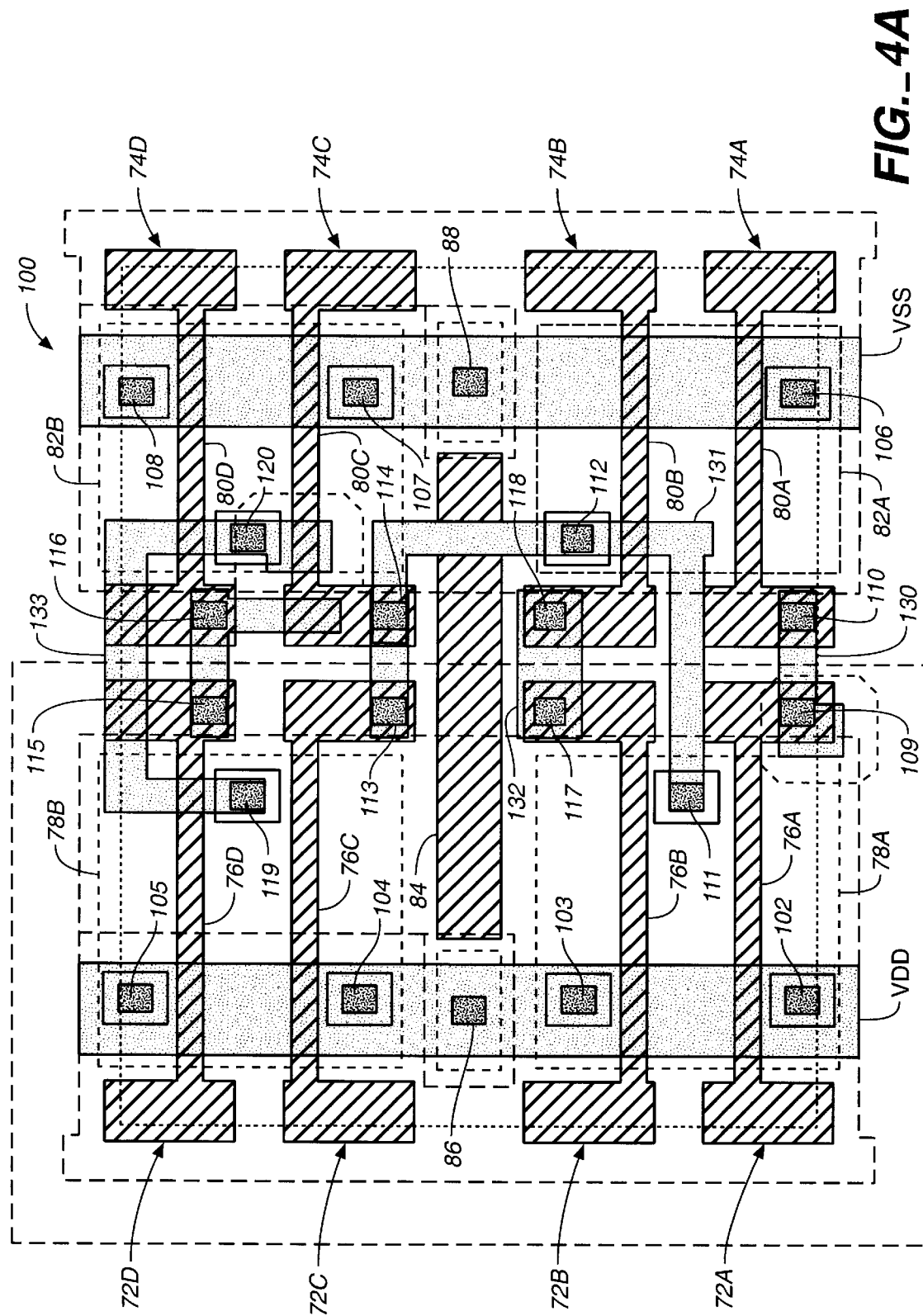
FIG._4A

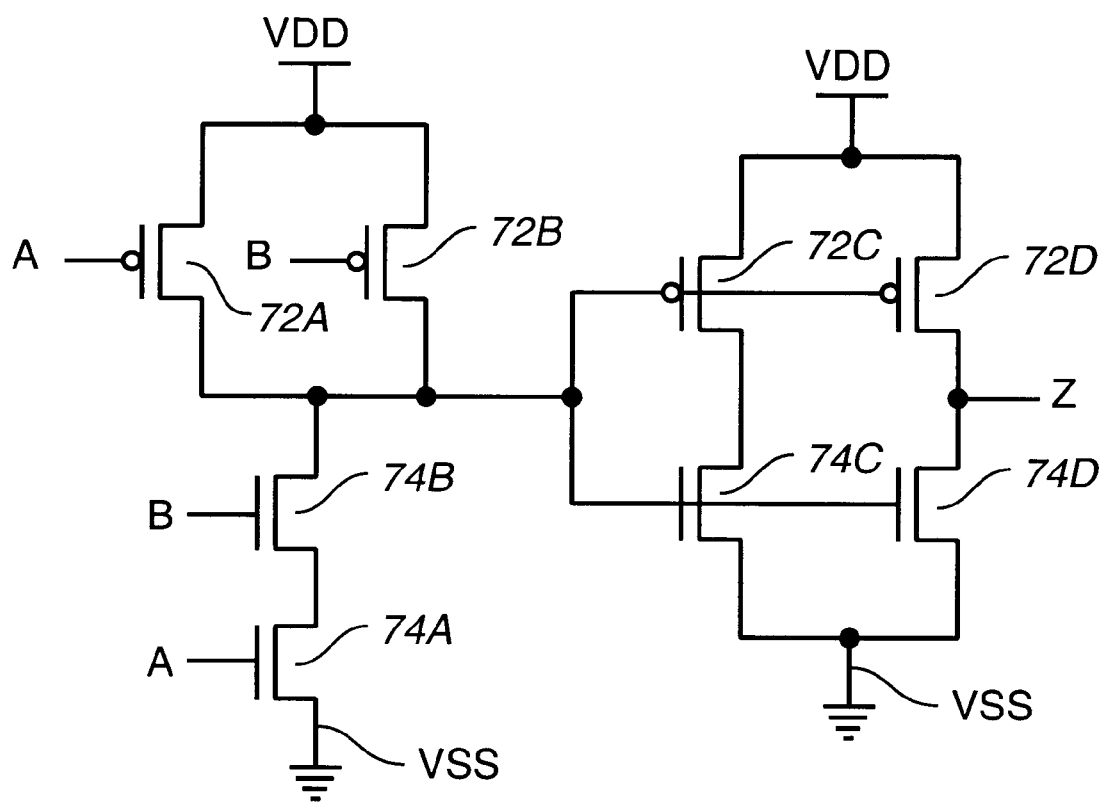
FIG._4B

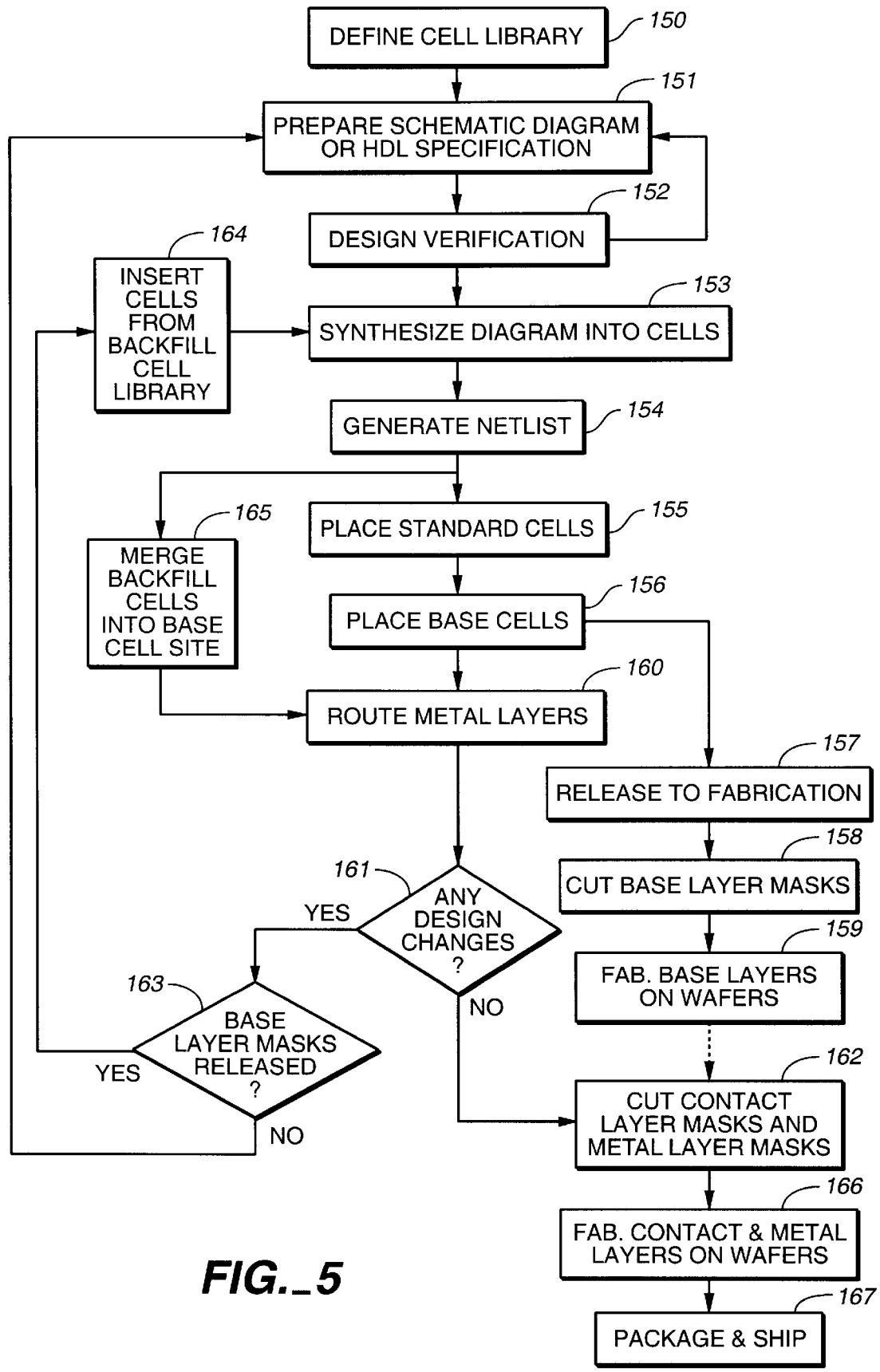
FIG._5

STANDARD CELL INTEGRATED CIRCUIT LAYOUT DEFINITION HAVING FUNCTIONALLY UNCOMMITTED BASE CELLS

BACKGROUND OF THE INVENTION

The present invention relates to a standard cell semiconductor integrated circuit layout definition and a method of generating a standard cell layout definition having functionally uncommitted base cells which aid subsequent design changes.

Semiconductor integrated circuits are designed and fabricated by first preparing a schematic diagram or hardware description language (HDL) specification of a logical circuit in which functional elements are interconnected to form a particular logical function. With standard cell technology, the schematic diagram or HDL specification is synthesized into standard cells of a specific cell library. Each standard cell corresponds to a logical function unit which is implemented by one or more transistors that are optimized for the cell. A series of computer-aided design tools generate a netlist of the selected cells and the interconnections between the cells. The netlist is used by a floor planner or placement tool to place the selected cells at particular locations in an integrated circuit layout pattern. The interconnections between the cells are then routed along predetermined routing layers. Once the selected cells have been placed and routed, the netlist, the cell layout definitions, the placement data and the routing data together form an integrated circuit layout definition which is used to fabricate the integrated circuit.

The integrated circuit is fabricated by depositing multiple layers on a substrate known as a wafer. The lowest, "base" layers include the active areas of the transistors, including the diffusion regions and the gate oxide areas, and the desired patterns of the polysilicon gate electrodes. These layers are fabricated through a sequence of pattern definition steps which are interspersed with other process steps such as oxidation, etching, doping and material deposition. The additive or subtractive process steps are proceeded by masking steps which define the desired geometric patterns on the wafer. One or more metal layers are then deposited on top of the base layers and-patterned to form conductive segments which interconnect the various semiconductor devices formed in the base layers. Electrical contacts or vias may be formed to electrically connect a conductive segment on one of the metal layers with a conductance segment or semiconductor device on one of the other layers on the wafer.

There is often a desire to release semiconductor designs to fabrication as early as possible in the design cycle. Subsequent design verification often results in the identification of design errors. Correction of the design errors may involve the addition of ore or more standard cells into the netlist, which results in changes or additions to the placement and routing data. Unfortunately, correction of these design errors can be extremely costly if made during the fabrication process. Correction may involve re-cutting the base layer mask set, re-cutting the metal layer mask set and, if wafer fabrication has begun, scrapping entire wafer lots.

One method of minimizing the effect of design changes on the fabrication process is to introduce extra standard cells into the initial semiconductor layout definition which can be used in the event a design change is needed. For example, extra NAND and NOR gates can be placed or "sprinkled" throughout the integrated circuit layout definition. However, this method has several disadvantages. Gate sprinkling suffers from the basic limitation that each added standard cell can perform only one specific function that is predetermined prior to the first pass of the fabrication process. Also, introducing extra cells into the initial design will have a detrimental effect on the amount of area needed to implement the design as each of the standard cells takes up space. Also, the floor planner or automatic placement tool will take these extra standard cells into account during the placement process. This reduces the quality of the placed design since the initial design will not have an optimum placement. The extra standard cells may also block valuable routing paths within one or more of the metal layers. The blocked routing paths are then unavailable to the routing tool, which effects the routability of the initial design.

SUMMARY OF THE INVENTION

The method of forming a layout definition of the present invention includes generating a netlist of functionally committed standard cell instances and the electrical interconnections between the standard cell instances; placing the standard cell instances in a layout pattern; and placing functionally uncommitted base cell instances in the layout pattern.

In one embodiment of the present invention, a design change is implemented by modifying the netlist to insert a functionally committed backfill cell instance which is geometrically compatible with a corresponding one of the base cell instances. The inserted backfill instance is substituted for the corresponding base cell instance in the layout pattern. After modifying the netlist and substituting the inserted backfill cell instance, electrical interconnection routing paths are defined between the backfill cell instance and at least one of the standard cell instances.

BRIEF DESCRIPTION OF THE DRAWINGS

FIG. 1 is a schematic representation of a fragmentary, cross-sectional view of a semiconductor integrated circuit that can be fabricated according to the present invention.

FIG. 2 is a partial diagram of a standard cell integrated circuit layout pattern which is used to fabricate a semiconductor integrated circuit, such as that shown in FIG. 1, according to one embodiment of the present invention.

FIG. 3 is a diagram of a layout pattern for a base cell according to one embodiment of the present invention.

FIG. 4A is a diagram or a backfill cell layout pattern for a two-input AND gate which is geometrically compatible with the base cell shown in FIG. 3.

FIG. 4B is a schematic diagram of the two-input AND gate shown in FIG. 4A.

FIG. 5 is a flow chart which illustrates a process of designing and fabricating a standard cell semiconductor integrated circuit according to one embodiment of the present invention.

DETAILED DESCRIPTION OF THE PREFERRED EMBODIMENTS

FIG. 1 is a schematic representation of a fragmentary, cross-sectional view of a semiconductor integrated circuit that can be fabricated according to the present invention. Semiconductor integrated circuit 10 includes a wafer or substrate 12. A metal-oxide semiconductor field-effect transistor (MOSFET) 14 is fabricated on wafer 12. A first photolithography mask is used to form the active areas of transistor 14, such as source and drain diffusion regions 16 and 18 and gate oxide layer 20. A second photolithography mask is used to define the desired pattern for polysilicon gate electrode 22. Other combinations of masks can be used to fabricate the transistor features in alternative embodiments or with alternative technologies. The masks used to pattern the transistor features and the polysilicon gate electrode are referred to as "base" layer masks.

After the base layers have been fabricated on wafer 12, a dielectric layer 24 is applied over the base layers. A third photolithography mask is used to form electrical contacts 26 and 28 which are electrically coupled to diffusion regions 16 and 18, for example. Additional photolithography masks are used to pattern metal routing layers 30 and 32 and conductive vias, such as via 34, which electrically connect conductive segments on one metal routing layer with conductive segments or contacts on other routing layers. Each metal routing layer is electrically isolated from the other metal routing layers by a dielectric layer, such as dielectric layer 36.

FIG. 2 is a partial diagram of a standard cell integrated circuit layout pattern which is used to fabricate a semiconductor integrated circuit, such as that shown in FIG. 1, according to one embodiment of the present invention. The layout pattern has a plurality of mask layers which are superimposed on one another in FIG. 2. Layout pattern 50 includes placed, functionally committed standard cell instances 52A–52H and a placed, functionally uncommitted base cell instance 54. Each standard cell instance 52A–52H has been selected from a predefined cell library. The standard cells in the cell library correspond to logical function units which are implemented by one or more transistors. For example, a typical CMOS two-input AND gate is implemented by six interconnected transistors. Additional transistors can be added to alter performance characteristics, such as increasing the gate drive strength. The standard cells in the cell library are each defined by a cell library definition. Each cell library definition includes a cell layout definition and cell characteristics. The layout definition includes a layout pattern of the transistors in the cell, geometry data for the cell's transistors aid cell routing data. The cell characteristics include a cell propagation delay and a model of the cell's function. The propagation delay is a function of the internal cell delay and the output loading of the cell.

Standard cell instances 52A–52H are placed in optimized locations in layout pattern 50 to facilitate routing of the interconnections between the cells. Once standard cell instances 52A–52H have been placed, "base" cell instances, such as base cell instance 54, are placed in any unused, open areas between standard cell instances 52A–52H. Each base cell instance includes one or more unconnected transistors which are preferably sized and arranged to conform to any specified design rules for the standard cell library.

Subsequent design changes to layout pattern 50 that involve the insertion of additional transistor devices can be implemented by "metalizing" the transistors in one or more of the base cell instances in later processing steps. If an additional cell needs to be added to layout pattern 50 after the base layer masks have been cut or after the base layers have been fabricated onto wafers, the additional cell may be selected from a "backfill" cell library. The backfill cell library includes one or more functionally committed backfill cells that are geometrically compatible with one or more of the previously placed base cell instances. Selected backfill cell is merged into an existing base cell location in layout pattern 50, such as the location of base cell instance 54. One or more of the metal routing layers are then re-routed, as necessary, to metalized the logical function of the backfill cell and to interconnect the backfill cell with the other cells in layout pattern 50. The backfill cell instances can be metalized to implement most of the basic logic functions, such as an AND, NAND, OR, NOR, inversion or input/output (I/O) buffer. Two or more contiguously placed base cell instances in layout pattern 50 can be used to implement more complex logical functions such as a multiplexer or a flip-flop, for example.

FIG. 3 is a diagram of a layout pattern for a base cell according to one embodiment of the present invention. Base cell 70 includes four P-type transistors 72A–72D and four N-type transistors 74A–74D. In alternative embodiments, any number of P-type and N-type transistors can be used in a given base cell. P-type transistors 72A–72D include polysilicon gate electrodes 76A–76D and diffusion regions 78A and 78B, respectively. Similarly, N-type transistors 74A–74D include polysilicon gate electrodes 80A–80D and diffusion regions 82A and 82B, respectively. A polysilicon strap 84 is defined between P-type transistors 72A–72D arid N-type transistors 74A–74D to aid in making electrical connections between the transistors if base cell 70 is eventually replaced with a backfill cell from the backfill cell library.

A power supply strap VDD and a ground supply strap VSS are defined within one of the metal routing layers to supply power to base cell 70. Contacts 86 and 88 are defined within the contact layer mask for electrically coupling power supply strap VDD and ground supply strap VSS to the substrate. No conductive segments or contacts are defined in the polysilicon layer or in any of the metal routing layers for making electrical connections from power and ground supply buses VDD and VSS to any one of the transistors 72A–72D and 74A–74D or between any of the transistors. This allows base cell 70 to have defined base layers while remaining functionally uncommitted.

FIG. 4A is a diagram of a backfill cell layout pattern for a complementary metal-oxide semiconductor (CMOS) two-input AND gate which is geometrically compatible with base cell 70 (shown in FIG. 3). FIG. 4B is a schematic diagram of the two-input AND gate shown in FIG. 4A. The same reference numerals are used in FIGS. 4A and 4B as were used in FIG. 3 for the same or similar elements. Backfill cell 100 includes P-type transistors 72A–72D, N-type transistors 74A–74D, polysilicon gate electrodes 76A–76D, diffusion regions 78A and 78B. polysilicon gate electrodes 80A–80D, diffusion regions 82A and 82B, polysilicon strap 84, contacts 86 and 88, power supply strap VDD and ground supply strap VSS.

The masks used to pattern the base layers, including polysilicon gate electrodes 76A–76D and 80A–80D, diffusion regions 78A, 78B, 82A and 82B and polysilicon strap 84 are identical to those masks used to pattern the same features in base cell 70 (shown in FIG. 3). However, backfill cell 100 defines additional contacts 102–122 in the contact layer mask and additional conductive segments 130–133 in one or more of the metal routing layer masks (preferably the lowest metal routing layer mask) for implementing the two-input AND gate function. Contacts 102–105 electrically connect power supply strap VDD to the sources of P-type transistors 72A–72D. Contacts 106–108 electrically connect power supply strap VSS to the sources of N-type transistors 74A, 74C and 74D. Contacts 109 and 110 electrically connect conductive segment 130 to polysilicon gate electrodes 76A and 80A of transistors 72A and 74A, respectively. Conductive segment 130 forms input "A" in FIG. 4B of the two-input AND gate.

Contacts 111–116 electrically connect conductive segment 131 to the drain of transistor 72A, the drain of transistor 74B, and to the polysilicon gate electrodes 76C, 76D, 80C and 80D of transistors 72C, 72D, 74C and 74D, respectively. Contacts 117 and 118 electrically connect conductive segment 132 to the polysilicon gate electrodes 76B and 80B of transistors 72B and 74B, respectively. Conductive segment 132 forms input "B" in FIG. 4B of the two-input AND gate. Contacts 119 and 129 electrically connect conductive segment 133 to the drains of transistors 72D and 74D. Conductive segment 133 forms output "Z" in FIG. 4B of the two-input AND gate.

Since backfill cell 100 is geometrically compatible with base cell 70, backfill 100 can be merged into base cell 70 without modifying the base layer mask set. The only changes that need to be made to the layout pattern are to the contact layer mask definition nd one of the metal routing layer mask definitions.

FIG. 5 is a flow chart which illustrates a process of designing and fabricating a standard cell semiconductor integrated circuit according to one embodiment of the present invention. Standard cell semiconductor integrated circuits are designed and fabricated by first selecting or defining the standard cell library, at step 150. The standard cell library is typically defined by the manufacturer of the integrated circuit.

Next, the logic designer prepares a schematic diagram or hardware description language (HDL) specification of a logical circuit, at step 151, in which instances of the standard cells in the cell library are selected and interconnected to form a desired logical function. The schematic diagram or HDL specification is then passed to a computer-aided design verification tool which assists the logic designer in verifying the desired logical function, at step 152. The design verification performed at step 152 often leads to changes in the schematic diagram or HDL specification prepared at step 151.

Once the schematic diagram or HDL specification is complete, it is passed to a series of additional computer-aided design tools, beginning at step 153, which assist the logic designer in converting the schematic diagram or HDL specification to a semiconductor integrated circuit layout definition which can be fabricated. At step 153, the schematic diagram or HDL specification is synthesized into the standard cells of the cell library defined in step 150. At step 154, the design tools generate a netlist of the selected standard cells and the interconnections between the cells. At step 155, the standard cell instances are "placed" to form a layout pattern for the integrated circuit by arranging the cells in selected locations. The standard cell instances may be placed manually or by an automatic placement tool.

Once all of the standard cell instances have been placed, functionally uncommitted base cells are placed in open areas in the layout pattern in and around the previously placed standard cell instances, at step 156. Again, the base cell instances may be placed manually or through an automatic placement tool. In one embodiment of the present invention, the manual or automatic placement process locates open areas or gaps in the layout pattern that are large enough to accommodate placement of a base cell instance. The base cell instances are then placed in the gaps. Placing the base cell instances in the open areas in the layout pattern results in minimal impact on the optimum placement of the standard cell instances in step 155. In one embodiment, the automatic placement tool has a default placement mode in which all of the gaps that are large enough to accommodate a base cell are filled with a base cell instance. The manual or automatic placement process may also be defined to move one or more standard cell instances one location to another to make room for placement of a base cell instance.

In an alternative embodiment, a selected area may be defined within the layout pattern, and the base cell instances are placed in only the gaps that are within the selected area. In another alternative embodiment, steps 155 and 156 are reversed such that the base cell instances are placed in the layout pattern prior to placing the standard cell instances. This would allow the base cell density to be defined, but would have a greater effect on the quality of the standard cell placement, at step 155. In another alternative embodiment, a reserved area is defined within the layout pattern for placing the base cell instances. In step 155, the standard cell instances are placed outside the reserved area. At step 156, the base cell instances are placed inside the reserved area. This embodiment would have the effect of blocking placement of the standard cell instances in the reserved area and would have a similar negative effect on the quality of the standard cell placement.

Once the standard and base cell instances have been placed, the netlist, layout pattern and corresponding cell definitions can be released to fabrication, at step 157. In fabrication, the base layer masks are cut at step 158. The base layer masks include the photolithography masks that are used for fabricating the semiconductor device features on the lowest layers of the wafer, such as the source and drain diffusion regions, the gate oxide areas and the polysilicon gate electrode patterns. Higher level masks include the photolithography masks that are used for patterning metal routing layers and the electrical contacts between layers. Once the base layer masks have been developed in step 158, the base layers may then be fabricated on the wafer at step 159.

Meanwhile, the logic designer may continue the design process by routing electrical interconnections between the placed standard cell instances along routing paths within the metal routing layers, at step 160. If there are no further design changes to the schematic diagram or HDL specification, at step 161, the routing data can be released to fabrication for use in cutting the metal layer photolithography masks, at step 162. Moving to step 163, if there are further design changes, and the base layer masks have not yet been released to fabrication, at step 157, then these changes can be made with another iteration through steps 150–156.

If the base layer masks have been released to fabrication, then any design change involving the insertion of additional semiconductor cells into the schematic diagram or HDL specification would normally require scrapping the base layer mask set and any wafers fabricated in steps 158 and 159. However, the presence of the placed, functionally uncommitted base cell instances allows insertion of additional cells into the design, at step 164, without requiring the base layer mask set to be re-cut. The additional semiconductor cells are selected from a backfill cell library, such as that discussed with reference to FIGS. 4A and 4B.

When the design changes to the schematic diagram or HDL specification has been completed, the previously existing cells are synthesized into standard cells from the standard cell library and the additional cells are synthesized into backfill cells from the backfill cell library, at step 153. An updated netlist is generated at step 154. Since the placement of the standard cell instances has not changed, the standard cell instances do not need to be re-placed at step 155. Rather, the additional backfill cell instances merged into existing base cell locations in the layout pattern, at step 165. The merge can be performed manually or automatically with a computer-aided design tool.

In a preferred embodiment, the manual or automatic merge process identifies the closest base cell location to an optimum placement position of the backfill cell instance, which is based on the interconnections between the backfill cell instance and the other cells within the layout pattern. The functionally committed backfill cell instance is then placed within the identified base cell location. Once all backfill cell instances have been merged into the layout pattern, the interconnections between the standard cell instances and the backfill cell instances are routed, as necessary, at step 160.

In one embodiment, the unused base cells that have not been converted to backfill cells are optionally converted to capacitor cells which insert the gate oxide capacitance of the transistors in the base cells between the power supply bus and the ground supply bus. This increases the power supply bus capacitance and thereby lowers power supply bus voltage transients in the core. The capacitor cells can be characterized in a cell library, similar to the standard cell and the backfill cells.

If there are no further design changes at step 160, the routing data can be released to fabrication. At step 162, the routing data is used to cut the electrical contact layer photolithography masks and the metal routing layer photolithography masks. The electrical contact layer and the metal routing layers are then fabricated on the wafers at step 163. In addition to making the electrical interconnections between the standard cells and the backfill cell instances, fabrication of the electrical contact layer and the metal routing layers also "metalizes" the backfill cell instances such that the transistors in the backfill cell instances implement the characterized logical function defined by the backfill cell library. The wafers are then sliced and diced into individual integrated circuit "chips" which are packaged and shipped at step 167.

Placing functionally uncommitted base cell instances in a standard cell layout pattern provides several advantages. First, the presence of the functionally uncommitted base cell instances reduces the risk associated with releasing integrated circuit designs to fabrication earlier in the design cycle since many design errors may be fixed prior to metalization. This allows for pre-fabrication of the base layers, thereby speeding the time to market. In a most aggressive use of the present invention, whole sections of logic in an integrated circuit design may be left incomplete and a block of functionally uncommitted base cells may be inserted into the layout pattern to allow for production of the base layers on the semiconductor wafers to proceed while the design is finalized.

Another advantage of the present invention is that design errors on wafers being fabricated can be fixed without having to scrap the wafers as long as the wafers have not been metalized. The present invention also allows for the banking of wafers prior to metalization to minimize disruption of production while a design change is being made. Yet another advantage of the present invention is that design changes that require additional logic cells do not require re-cutting the base layer mask set since the functionally uncommitted base cell instances are already in the base layer mask set. The additional logic cells can be implemented by simply metalizinc the transistors in the base cells.

Placing functionally uncommitted base cells in a standard cell layout pattern therefore allows much greater flexibility in implementing metalization changes in a semiconductor design at less cost than the previous method of inserting spare, functionally committed, standard cells. The process of inserting the functionally uncommitted base cells can be made transparent to the initial design and layout of the integrated circuit by not effecting either area or routability of the initial design. This process can also be used to place an area of functionally uncommitted base cells into an integrated circuit design to allow for earlier release of base layers to manufacturing.

Although the present invention has been described with reference to preferred embodiments, workers skilled in the art will recognize that changes may be made in form and detail without departing from the spirit and scope of the invention.

What is claimed is:

1. A method of forming a layout definition of a semiconductor integrated circuit, comprising:

generating a netlist of functionally committed standard cell instances and the electrical interconnections between the standard cell instances;

placing the standard cell instances in a layout pattern; and placing functionally uncommitted base cell instances in the layout pattern, wherein each base cell instance has an uncommitted logical function.

2. The method of claim 1 and further comprising:

modifying the netlist to insert a functionally committed backfill cell instance which is geometrically compatible with a corresponding one of the base cell instances; and substituting the inserted backfill instance for the corresponding base cell instance in the layout pattern.

3. The method of claim 2 and further comprising:

defining electrical interconnection routing paths between the standard cell instances after placing the standard cell instances and before modifying the netlist; and defining electrical interconnection routing paths between the backfill cell instance and at least one of the standard cell instances after modifying the netlist and substituting the inserted backfill cell instance.

4. The method of claim 2 and further comprising:

selecting a capacitor cell from a predefined cell library;

substituting instances of the capacitor cell for any base cell instance in the layout pattern that has not been substituted with a corresponding backfill cell instance; and defining electrical interconnection routing paths for electrically coupling each capacitor cell instance between a power bus and a ground bus in the layout pattern.

5. The method of claim 1 wherein the step of placing the base cell instances comprises:

identifying gaps between the standard cell instances in the layout pattern that would accommodate the base cell instances; and placing the base cell instances in the gaps.

6. The method of claim 1 wherein the step of placing the base cell instances comprises:

defining a selected area within the layout pattern;

identifying gaps between the standard cell instances in the selected area of layout pattern that would accommodate at least one of the base cell instances; and placing the base instances in the gaps.

7. The method of claim 1 wherein the step of placing the base cell instances comprises placing the base cell instances in the layout pattern prior to placing the standard cell instances.

8. The method of claim 1 and further comprising:

defining a reserved area within the layout pattern for placing the base cell instances;

wherein the step of placing the standard cell instances comprises placing the standard cell instances outside the reserved area; and wherein the step of placing the base cell instances comprises placing the base cell instances inside the reserved area.

9. The method of claim 1 wherein placing the base cell instances comprises moving at least one of the standard cell instances from a first location in the layout pattern to a second location in the layout pattern and then placing one of the base cell instances in an area that comprises the first location.

10. A semiconductor layout definition comprising:

a netlist of interconnected, functionally committed standard cells, wherein each standard cell is selected from a predetermined cell library;

placement data indicating placement of the interconnected standard cells in a layout pattern;

placement data indicating placement of functionally uncommitted base cells in the layout pattern, wherein each base cell is selected from the predetermined cell library and has an uncommitted logical function; and routing data indicating electrical routing paths between the interconnected standard cells.

11. A method of forming a layout definition of a semiconductor integrated circuit, comprising:

selecting functionally committed standard cell instances from a cell library;

selecting functionally uncommitted base cell instances from the cell library, wherein each base cell instance has an uncommitted logical function;

placing the standard cell instances and the base cell instances in a layout pattern; and defining routing paths in predetermined routing layers of the semiconductor integrated circuit for electrically interconnecting the standard cell instances.

12. The method of claim 11 and further comprising:

selecting functionally committed backfill cell instances from the cell library, wherein each backfill cell instance is geometrically compatible with a corresponding one of the base cell instances; and substituting the selected backfill instances for the corresponding base cell instances in the layout pattern.

13. The method of claim 12 and further comprising:

defining routing paths in the predetermined routing layers for electrically interconnecting the backfill cell instances with the standard cell instances after substituting the selected backfill cell instances.

14. The method of claim 12 and further comprising:

defining a capacitor cell within the cell library;

substituting instances of the capacitor cell for any of the base cell instances in the layout pattern that have not been substituted with a corresponding backfill cell instance; and defining routing paths in the predetermined routing layers for electrically interconnecting each capacitor cell instance in the layout pattern between a power bus and a ground bus.

15. The method of claim 11 wherein the step of placing the standard cell instances and the base cell instances comprises:

placing the standard cell instances before placing the base cell instances;

identifying gaps between the standard cell instances in the layout pattern that would accommodate the base cell instances; and placing the base instances in the gaps.

16. The method of claim 11 wherein the step of placing the standard cell instances and the base cell instances comprises:

defining a selected area within the layout pattern;

placing the standard cell instances before placing the base cell instances;

identifying gaps between the standard cell instances in the selected area of layout pattern that would accommodate base cell instances; and placing the base instances in the gaps.

17. The method of claim 11 wherein the step of placing the standard cell instances and the base cell instances comprises placing the base cell instances in the layout pattern prior to placing the standard cell instances.

18. The method of claim 11 and further comprising:

defining a reserved area within the layout pattern for placing the base cell instances; and wherein the step of placing the standard cell instances and the base cell instances comprises placing the standard cell instances outside the reserved area and placing the base cell instances inside the reserved area.

19. The method of claim 11 wherein placing the standard cell instances and the base cell instances comprises:

placing the standard cell instances before placing the base cell instances; and moving at least one of the standard cell instances from a first location in the layout pattern to a second location in the layout pattern and then placing one of the base cell instances in an area that comprises the first location.

20. An apparatus for forming a layout definition of a semiconductor integrated circuit, the apparatus comprising:

means for generating a netlist of functionally committed standard cell instances and the electrical interconnections between the standard cell instances;

means for placing the standard cell instances in a layout pattern; and means for placing functionally uncommitted base cell instances in the layout pattern, wherein each base cell instance has an uncommitted logical function.

21. A computer readable medium comprising program code which, when executed by a computer cause the computer to perform steps of:

generating a netlist of functionally committed standard cell instances and the electrical interconnections between the standard cell instances;

placing the standard cell instances in a layout pattern; and placing functionally uncommitted base cell instances in the layout pattern, wherein each base cell instance has an uncommitted logical function.

* * * * *